United States Patent
Tanaka

(10) Patent No.: US 8,964,477 B2
(45) Date of Patent: Feb. 24, 2015

(54) NONVOLATILE MEMORY, ELECTRONIC APPARATUS, AND VERIFICATION METHOD

(71) Applicant: Fujitsu Semiconductor Limited, Yokohama, Kanagawa (JP)

(72) Inventor: Kengo Tanaka, Tachikawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 146 days.

(21) Appl. No.: 13/856,205

(22) Filed: Apr. 3, 2013

(65) Prior Publication Data

US 2013/0272074 A1 Oct. 17, 2013

(30) Foreign Application Priority Data

Apr. 11, 2012 (JP) ................. 2012-090226

(51) Int. Cl.
*G11C 11/34* (2006.01)
*G11C 7/14* (2006.01)
*G11C 16/34* (2006.01)
*G11C 16/28* (2006.01)
*G11C 16/30* (2006.01)
*G11C 16/08* (2006.01)

(52) U.S. Cl.
CPC ............. *G11C 7/14* (2013.01); *G11C 16/3445* (2013.01); *G11C 16/28* (2013.01); *G11C 16/30* (2013.01); *G11C 16/08* (2013.01)
USPC ............. 365/185.2; 365/210.14; 365/210.15; 365/185.29

(58) Field of Classification Search
USPC ............... 365/185.2, 210.14, 210.15, 185.29
See application file for complete search history.

(56) References Cited

U.S. PATENT DOCUMENTS 6,438,035 B2 * 8/2002 Yamamoto et al. ...... 365/185.21
2013/0343127 A1 * 12/2013 Goda et al. ............... 365/185.11

FOREIGN PATENT DOCUMENTS

| JP | 9-502823 A | 3/1997 |
| JP | 2006-114154 A | 4/2006 |
| WO | WO 94/28549 A2 | 12/1994 |

* cited by examiner

*Primary Examiner* — Han Yang
(74) *Attorney, Agent, or Firm* — Arent Fox LLP

(57) ABSTRACT

A gate voltage generator which supplies first gate voltage at erase verify time to a first selected word line to which a first memory cell included in N memory cells is connected, which supplies the first gate voltage at the erase verify time to a second selected word line to which a first reference cell included in M reference cells is connected, which supplies second gate voltage at the erase verify time to a first non-selected word line connected to a memory cell array, and which supplies third gate voltage at the erase verify time to a second non-selected word line connected to a reference cell array is included. An electric current which flows through a reference cell connected to the second non-selected word line is stronger than an electric current which flows through a memory cell connected to the first non-selected word line.

8 Claims, 11 Drawing Sheets

NONVOLATILE MEMORY, ELECTRONIC APPARATUS, AND VERIFICATION METHOD

CROSS-REFERENCE TO RELATED APPLICATION

This application is based upon and claims the benefit of priority of the prior Japanese Patent Application No. 2012-090226, filed on Apr. 11, 2012, the entire contents of which are incorporated herein by reference.

FIELD

The embodiments discussed herein are related to a nonvolatile memory, an electronic apparatus, and a verification method.

BACKGROUND

In addition to a memory cell array, a nonvolatile memory, such as a flash memory, includes a reference cell array used at the time of performing various tests.

For example, in order to verify at erase test time whether or not a memory cell to which an erase pulse is applied is in an erased state, an electric current which flows along a bit line to which the memory cell is connected is compared with an electric current which flows along a bit line to which a reference cell for erase verify is connected. For example, if an electric current which flows along the bit line to which the memory cell is connected is stronger than an electric current which flows along the bit line to which the reference cell is connected, then a verification result is "Pass". That is to say, the determination that erase is correctly performed is made.

Japanese Laid-open Patent Publication No. 2006-114154
Japanese National Publication of International Patent Publication No. 09-502823

However, a non-selected memory cell is also connected to a bit line to which a memory cell selected at verification time is connected. When erase verify is performed, a correct verification result may not be obtained because of a leakage current which flows through the non-selected memory cell. For example, an electric current which flows through a memory cell, which is an object of verification, may be weaker than an electric current which flows through a reference cell. However, a leakage current which flows through a non-selected memory cell also flows along a bit line. As a result, an entire electric current may exceed the electric current which flows through the reference cell, and the erroneous determination that a verification result is "Pass" may be made. One of reasons for this may be that a reference cell array is smaller than a memory cell array, that the number of reference cells connected to one bit line is smaller than that of memory cells connected to one bit line, and that a leakage current which flows along a bit line to which a reference cell is connected is weaker than a leakage current which flows along a bit line to which a selected memory cell is connected.

SUMMARY

According to an aspect, there is provided a nonvolatile memory including a memory cell array having a first bit line connected to N memory cells, a reference cell array having a second bit line connected to M reference cells, a comparator which compares a first electric current which flows along the first bit line with a second electric current which flows along the second bit line, and a gate voltage generator which supplies first gate voltage at erase verify time to a first selected word line to which a first memory cell included in the N memory cells is connected, which supplies the first gate voltage at erase verify time to a second selected word line to which a first reference cell included in the M reference cells is connected, which supplies second gate voltage at erase verify time to a first non-selected word line connected to the memory cell array, and which supplies third gate voltage at erase verify time to a second non-selected word line connected to the reference cell array, the M being smaller than the N, an electric current which flows through a reference cell connected to the second non-selected word line being stronger than an electric current which flows through a memory cell connected to the first non-selected word line.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
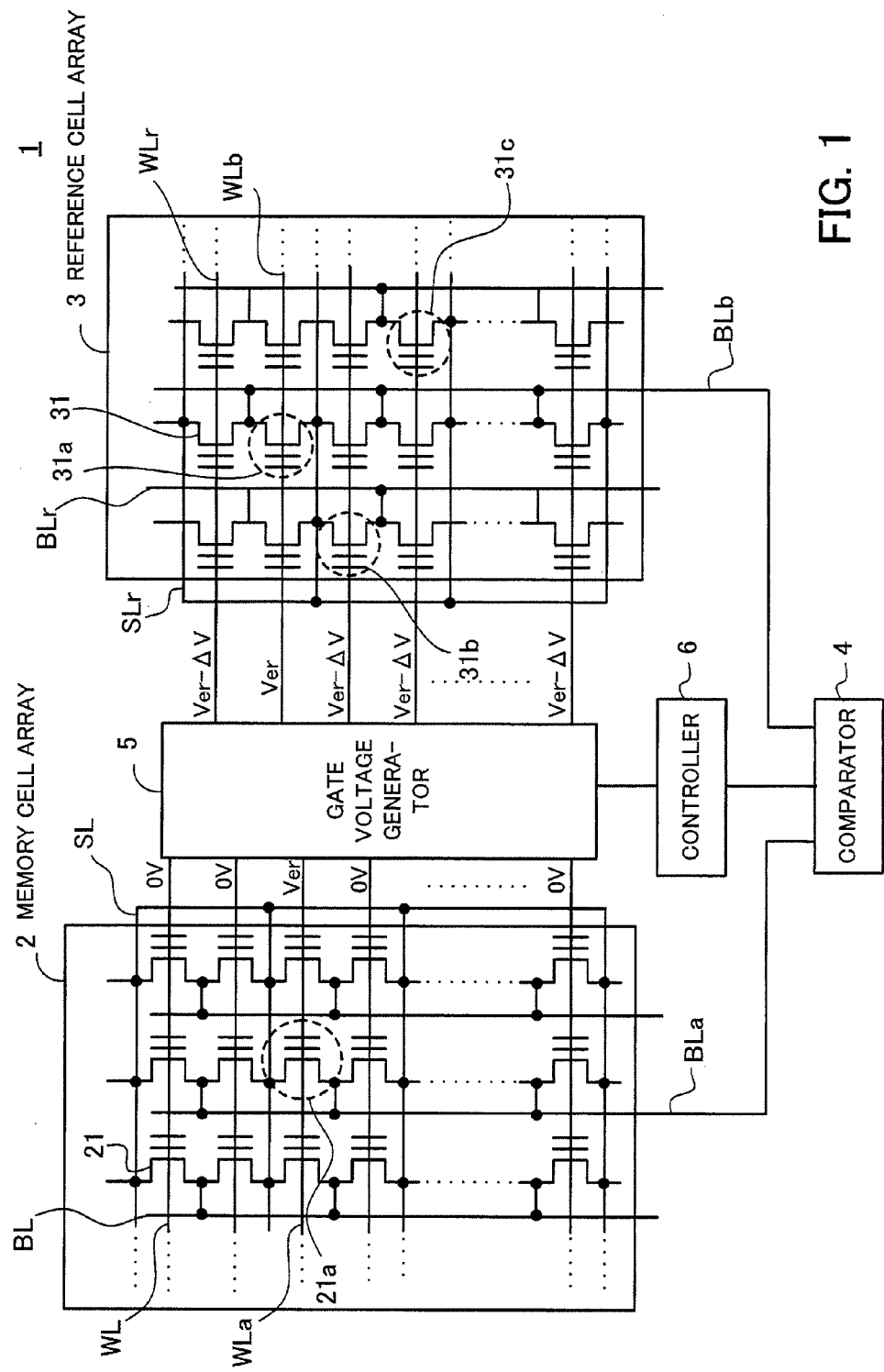
FIG. 1 is an example of a nonvolatile memory according to a first embodiment.

Embodiments will now be described with reference to the accompanying drawings, wherein like reference numerals refer to like elements throughout.

First Embodiment

FIG. 1 is an example of a nonvolatile memory according to a first embodiment.

A nonvolatile memory 1 is, for example, an EEPROM (Electrically Erasable Programmable Read-Only Memory), such as a flash memory, and includes a memory cell array 2, a reference cell array 3, a comparator 4, a gate voltage generator 5, and a controller 6.

The memory cell array 2 includes a plurality of memory cells 21. In addition, the memory cell array 2 includes a plurality of bit lines BL to each of which N memory cells 21 are connected. N is, for example, 64, 128, or 256.

The reference cell array 3 includes a plurality of reference cells 31. In addition, the reference cell array 3 includes a plurality of bit lines BLr to each of which M (M<N) reference cells 31 are connected. For example, about 10 to 20 reference cells 31 are connected to each bit line BLr. However, there is a reference cell 31 which is not connected to a bit line BLr.

In the example of FIG. 1, a reference cell 31 in the reference cell array 3 selected at erase verify time is denoted by a "reference cell 31a". A reference cell 31b or 31c is selected, for example, at program verify time or soft program verify time.

Furthermore, in addition to the bit lines BL, the memory cell array 2 includes word lines WL and a source line SL. A memory cell 21 is connected to them according to circumstances (indicated by black dots in FIG. 1). In addition to the bit lines BLr, the reference cell array 3 includes word lines WLr and a source line SLr. A reference cell 31 is connected to them according to circumstances (indicated by black dots in FIG. 1).

In the example of FIG. 1, all the memory cells 21 included in the memory cell array 2 are connected to the source line SL and the bit lines BL. In addition, other reference cells 31 are connected to a bit line (hereinafter referred to as a bit line BLb) in the reference cell array 3 connected to a reference cell 31a for erase verify. These reference cells 31 are also connected to the source line SLr. On the other hand, no other reference cells 31 are connected to a bit line BLr connected to a reference cell 31b, except the one adjacent to the reference cell 31b. Similarly, no other reference cells 31 are connected to a bit line BLr connected to a reference cell 31c, except the one adjacent to the reference cell 31c.

In FIG. 1, components, such as a decoder for selecting a memory cell 21 or a reference cell 31, are not illustrated.

In order to verify the state of a plurality of memory cells 21, the comparator 4 compares an electric current which flows along a bit line BL to which a memory cell 21, which is an object of verification, is connected with an electric current which flows along a bit line BLr to which a reference cell 31, which is an object of comparison, is connected, and outputs a comparison result.

In FIG. 1, an electric current which flows along a bit line BLa to which a memory cell 21a is connected is compared with an electric current which flows along the bit line BLb to which the reference cell 31a for erase verify is connected. If an electric current which flows along the bit line BLa is stronger at erase verify time than an electric current which flows along the bit line BLb, then the comparator 4 outputs "Pass" ("1", for example) as a comparison result. Furthermore, if an electric current which flows along the bit line BLa is weaker than or equal to an electric current which flows along the bit line BLb, then the comparator 4 outputs "Fail" ("0", for example) as a comparison result.

The gate voltage generator 5 supplies gate voltage to a memory cell 21 or a reference cell 31 via a word line WL or WLr. Furthermore, when the comparator 4 makes a comparison at erase verify time, the gate voltage generator 5 supplies first gate voltage to a memory cell 21, which is an object of verification, and a reference cell 31, which is an object of comparison, via selected word lines. When, as indicated in the example of FIG. 1, the memory cell 21a is an object of verification and the reference cell 31a is an object of comparison, word lines WLa and WLb are selected word lines.

In addition, the gate voltage generator 5 in the first embodiment also supplies second gate voltage to a non-selected reference cell connected to a non-selected word line. As a result, an electric current which flows along a bit line BLr to which a reference cell 31, which is an object of comparison, is connected increases compared with a case where gate voltage is applied only to the reference cell 31, which is an object of comparison. In the example of FIG. 1, the word lines WLr other than the word line WLb are non-selected word lines and reference cells 31 connected to the non-selected word lines are non-selected reference cells to which the second gate voltage is supplied. Furthermore, the plurality of non-selected reference cells (reference cells 31 other than the reference cell 31a) are connected to the bit line BLb, so an electric current which flows along the bit line BLb increases by applying the second gate voltage to these non-selected reference cells.

In the example of FIG. 1, the first gate voltage is voltage Ver and the second gate voltage is voltage (Ver-$\Delta$V).

The controller 6 controls each section of the nonvolatile memory 1. For example, if the comparator 4 determines as a result of erase verify that a memory cell 21 is "Fail", then the controller 6 exercises control so as to apply an erase pulse to a memory cell group (hereinafter referred to as a "sector") including the memory cell 21. Furthermore, for example, if the comparator 4 outputs "Pass" for all memory cells 21 in a sector, then the controller 6 stops application of an erase pulse to the sector.

An example of the operation of the nonvolatile memory 1 at erase test time will now be described.

For example, at erase test time an erase pulse is applied to a plurality of memory cells 21 in a sector. After that, the plurality of memory cells 21 are selected one by one and erase verify is performed. As indicated in FIG. 1, for example, the memory cell 21a is selected and the bit line BLa connected to the memory cell 21a is connected to one input terminal of the comparator 4. On the other hand, the reference cell 31a for erase verify is selected in the reference cell array 3 and the bit line BLb connected to the reference cell 31a is connected to the other input terminal of the comparator 4.

At erase verify time the gate voltage generator 5 supplies the voltage Ver as gate voltage to gates of the memory cell 21a and the reference cell 31a for erase verify via the word lines WLa and WLb respectively. In the memory cell array 2 the potential of the word lines WL (non-selected word lines) other than the word line WLa to which the gate of the memory cell 21a is connected is 0 V. There is no special limit to the value of the voltage Ver. However, for example, a value by which a drain-source current of 10 $\mu$A flows at the time of drain voltage Vd being 1 V is used. 10 $\mu$A is an example of a target electric current.

In addition, the gate voltage generator 5 supplies voltage (Ver-$\Delta$V) as gate voltage to non-selected reference cells connected to non-selected word lines in the reference cell array 3.

At this time memory cells 21 other than the selected memory cell 21a are also connected to the bit line BLa. Accordingly, even when gate voltage is 0 V, a weak leakage (column leakage) current flows and an electric current which flows along the bit line BLa increases. As the temperature rises, a leakage current increases.

Similarly, a leakage current flows when gate voltage for reference cells 31 connected to the bit line BLb in the reference cell array 3 is 0 V. As stated above, however, the number of the reference cells 31 connected to the bit line BLb is smaller than that of the memory cells 21 connected to the bit line BLa. As a result, a difference in leakage current arises and there is a possibility that the comparator 4 fails to obtain a correct verification result.

With the nonvolatile memory 1 according to the first embodiment, however, the gate voltage generator 5 also supplies gate voltage to non-selected reference cells to increase an electric current which flows along the bit line BLb. In the example of FIG. 1, the plurality of reference cells 31, which are non-selected reference cells, are connected to the bit line BLb. If gate voltage is also supplied to these reference cells 31, an electric current which flows along the bit line BLb increases compared with a case where gate voltage is supplied only to the reference cell 31a.

This makes it possible to make the difference between a leakage current which flows into the bit line BLa in the memory cell array 2 and an electric current which flows through the reference cells 31 other than the reference cell 31a in the reference cell array 3 and which flows into the bit line BLb small. That is to say, the influence of a leakage current which flows into the bit line BLa on a result of comparison by the comparator 4 can be reduced.

Therefore, it is possible to prevent the comparator 4 from producing an erroneous verification result and to control a deterioration in the accuracy of verification at erase verify time due to a leakage current.

Second Embodiment

Figure 2:
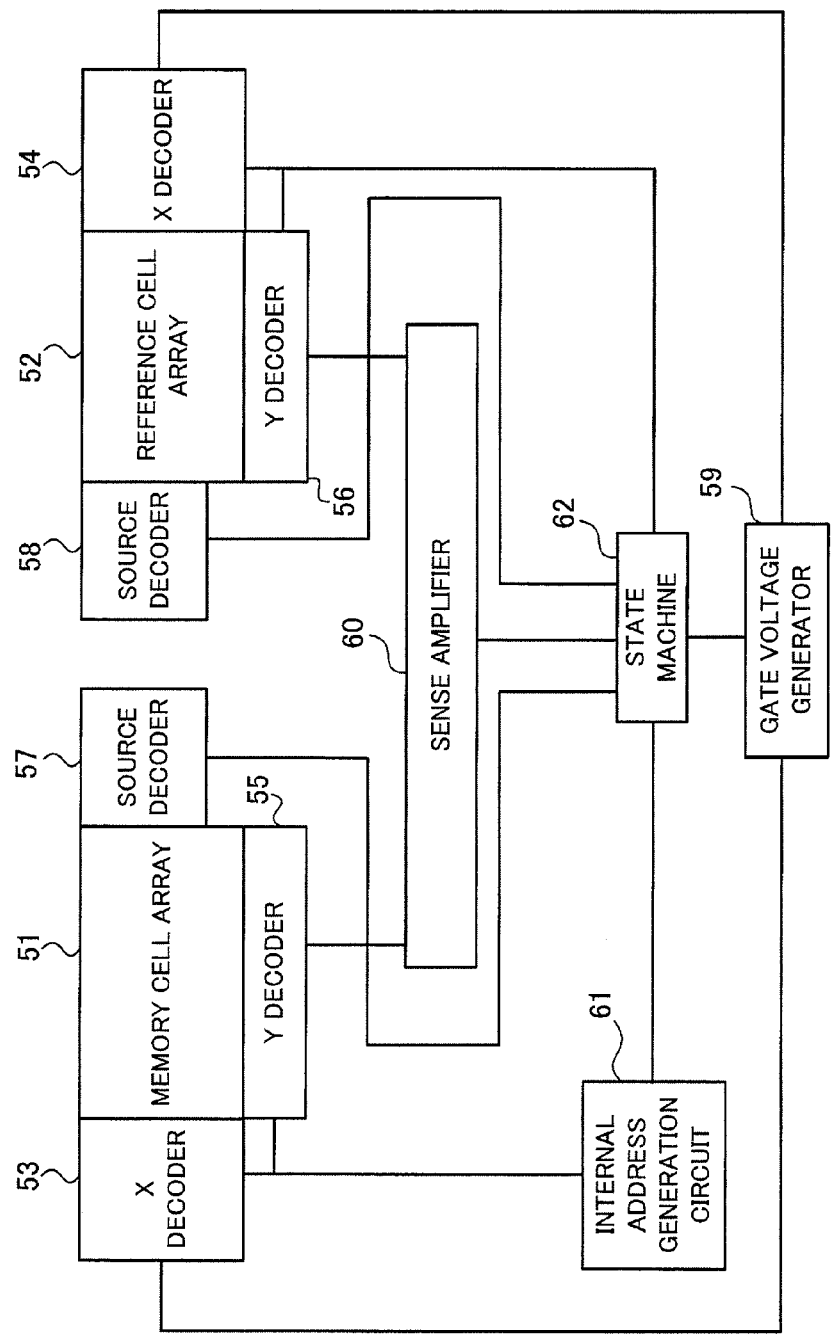
FIG. 2 is an example of a nonvolatile memory according to a second embodiment.

FIG. 2 is an example of a nonvolatile memory according to a second embodiment.

A nonvolatile memory 50 is, for example, an EEPROM, such as a flash memory, and includes a memory cell array 51 and a reference cell array 52. In addition, the nonvolatile memory 50 includes X decoders 53 and 54, Y decoders 55 and 56, source decoders 57 and 58, a gate voltage generator 59, a sense amplifier 60, an internal address generation circuit 61, and a state machine 62.

The circuit structure of the memory cell array 51 is the same as that of the memory cell array 2 illustrated in FIG. 1. The circuit structure of the reference cell array 52 is the same as that of the reference cell array 3 illustrated in FIG. 1.

The X decoder 53 selects a word line connected to a memory cell on the basis of an internal address (row address) supplied from the internal address generation circuit 61, and applies to the word line gate voltage generated by the gate voltage generator 59. The X decoder 54 selects a word line connected to a reference cell on the basis of a selection signal from the state machine 62, and applies to the word line gate voltage generated by the gate voltage generator 59.

The Y decoder 55 selects a bit line connected to a memory cell on the basis of an internal address (column address) supplied from the internal address generation circuit 61, and connects the bit line to the sense amplifier 60. The Y decoder 56 selects a bit line connected to a reference cell on the basis of a selection signal from the state machine 62, and connects the bit line to the sense amplifier 60.

On the basis of a control signal from the state machine 62, the source decoder 57 or 58 applies determined voltage to the source line in the memory cell array 51 or the reference cell array 52.

The gate voltage generator 59 has the same function that the above gate voltage generator 5 illustrated in FIG. 1 has. The gate voltage generator 59 generates determined gate voltage on the basis of mode signals from the state machine 62.

The sense amplifier 60 is a differential sense amplifier. The sense amplifier 60 has the same function that the above comparator 4 illustrated in FIG. 1 has. The sense amplifier 60 compares an electric current which flows along a bit line to which a memory cell, which is an object of verification, is connected with an electric current which flows along a bit line to which a reference cell, which is an object of comparison, is connected, and outputs a comparison result to the state machine 62.

The internal address generation circuit 61 generates internal addresses (row address and column address) on the basis of external addresses inputted from an external address terminal (not illustrated). In addition, for example, the internal address generation circuit 61 increments an internal address at test time on the basis of a control signal from the state machine 62.

The state machine 62 controls each section of the nonvolatile memory 50.

(Verification Method at Erase Test Time)

Figure 3:
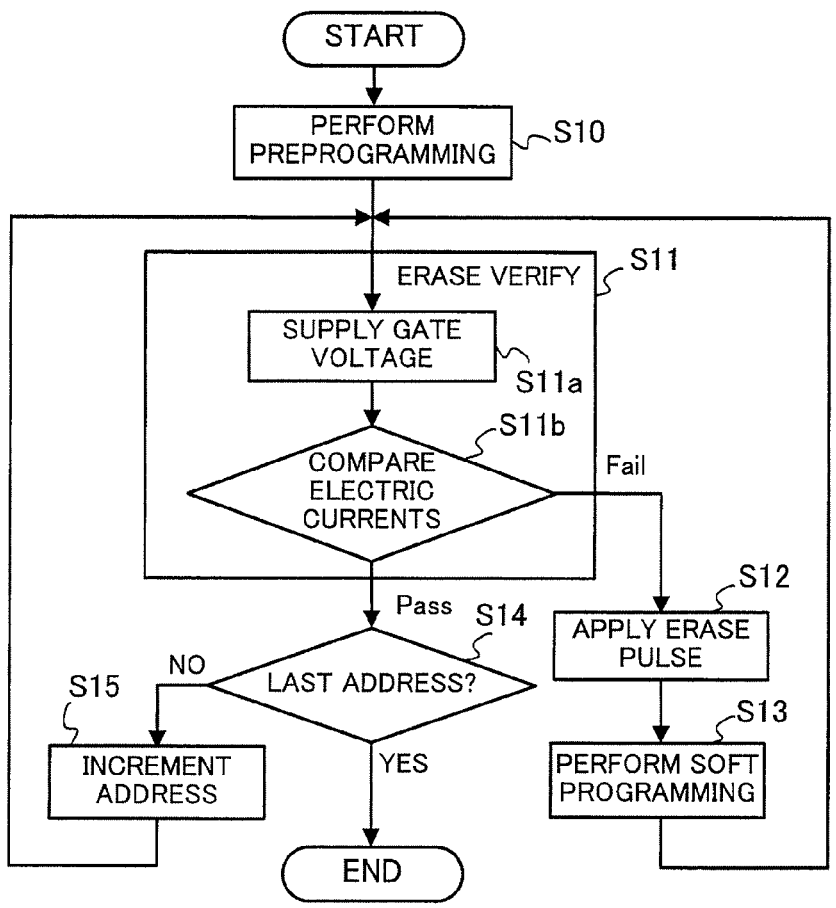
FIG. 3 is a flow chart of an example of a verification method at erase test time.

FIG. 3 is a flow chart of an example of a verification method at erase test time.

In FIG. 3, attention is paid to erase verify and program verify, soft program verify, and the like are omitted.

First all memory cells in a sector are temporarily preprogrammed under the control of the state machine 62 (step S10). As a result, all the memory cells in the sector go into a written state.

After that, erase verify is performed on the memory cells one bit (one memory cell) at a time (step S11). The erase verify includes the supply of gate voltage to a memory cell and a reference cell (step S11a) and electric current comparison by the sense amplifier 60 (step S11b).

If the verification result "Fail" is obtained by erase verify, then an erase pulse is applied to the entire sector (step S12). If threshold voltage (gate voltage at which drain-source current begins to flow) of a memory cell is lower than or equal to 0 V after the application of an erase pulse, then the memory cell is in an over-erased state. Even when the voltage of a word line is 0 V, an electric current flows through the memory cell. In order to avoid this over-erased state, soft programming is performed after the application of an erase pulse. That is to say, a write pulse having a comparatively low voltage is applied to slightly increase the threshold voltage (step S13). Soft programming is performed on a memory cell for which the determination "Fail" is made by soft program verify (not indicated in FIG. 3). After that, the process is repeated from step S11.

On the other hand, if the verification result "Pass" is obtained by erase verify, then the state machine determines whether or not the verification result "Pass" is obtained up to a memory cell at the last address in the sector (step S14). If the verification result "Fail" is obtained up to the memory cell at the last address in the sector, then the state machine 62 makes the internal address generation circuit 61 increment an address (step S15), and repeats the process from step S11.

If the verification result "Pass" is obtained up to the memory cell at the last address in the sector, then the erase test ends.

Figure 4:
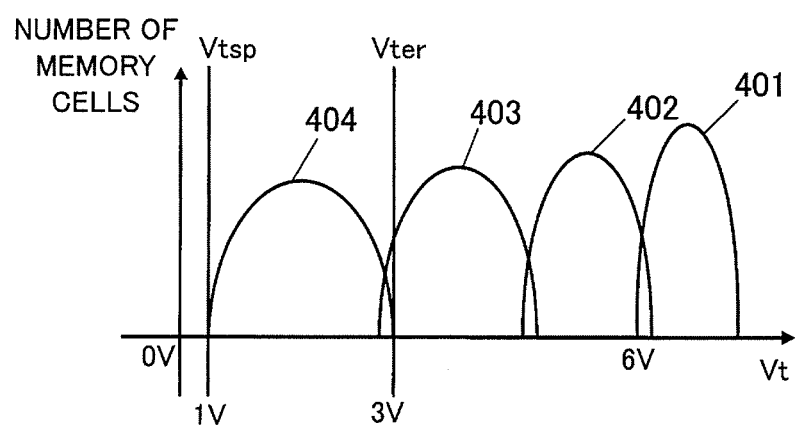
FIG. 4 is an example of a change in the distribution of threshold voltage of memory cells at erase test time.

FIG. 4 is an example of a change in the distribution of threshold voltage of memory cells at erase test time. In FIG. 4, a vertical axis indicates the number of memory cells and a horizontal axis indicates threshold voltage Vt.

In this case, threshold voltage Vt of a memory cell after preprogramming is about 6 V (drain voltage Vd=1 V and cell current Id=10 μA). This is initial threshold voltage distribution. When the erase verify and the application of an erase pulse indicated in FIG. 3 are repeated, entire threshold voltage distribution gradually shifts to the low Vt side, that is to say, in the direction of threshold voltage distribution 401→402→403→404 indicated in FIG. 4. As the number of times the erase verify is repeated increases, threshold voltage distribution becomes broader. The reason for this is that an erase pulse is applied by the sector.

For example, it is assumed that, as indicated in FIG. 4, threshold voltage Vter at which a memory cell goes into an erased state is 3 V (Vd=1 V and Id=10 μA). When threshold voltage Vt of all memory cells in a sector becomes lower than or equal to 3 V, the verification result "Pass" is obtained for the sector. Furthermore, soft programming is performed for preventing over-erase, so after the erase test $$Vtsp<Vt<Vter$$

where Vtsp is threshold voltage for soft program verify and is 1 V (Vd=1 V and Id=10 µA) in the example of FIG. 4.

By the way, when Vt distribution as a whole shifts to a low voltage side, a leakage current begins to flow in a memory cell near the left edge of the Vt distribution. A leakage current has the property of increasing in a high-temperature environment.

Figure 5:
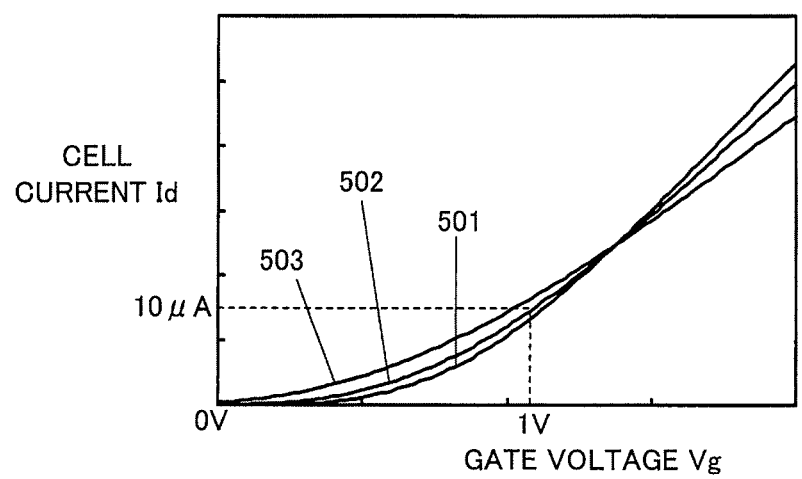
FIG. 5 is an example of the relationship between the temperature and the Id-Vg characteristic of a memory cell.

FIG. 5 is an example of the relationship between the temperature and the Id-Vg characteristic of a memory cell. In FIG. 5, a horizontal axis indicates cell current Id and a horizontal axis indicates gate voltage Vg. At soft program verify time it is assumed that Vg=1 V, that Vd=1 V, that Id=10 µA, and that the temperature is 25° C.

In FIG. 5, curves 501, 502, and 503 indicate the Id-Vg characteristic of a memory cell at temperatures of −40° C., 25° C., and 150° C. respectively. It turns out that in a region in which gate voltage (word line voltage) is low, cell current Id is stronger at a higher temperature. Accordingly, a leakage current which flows at erase verify time through a non-selected memory cell connected to a non-selected word line is stronger at a higher temperature.

Figure 6:
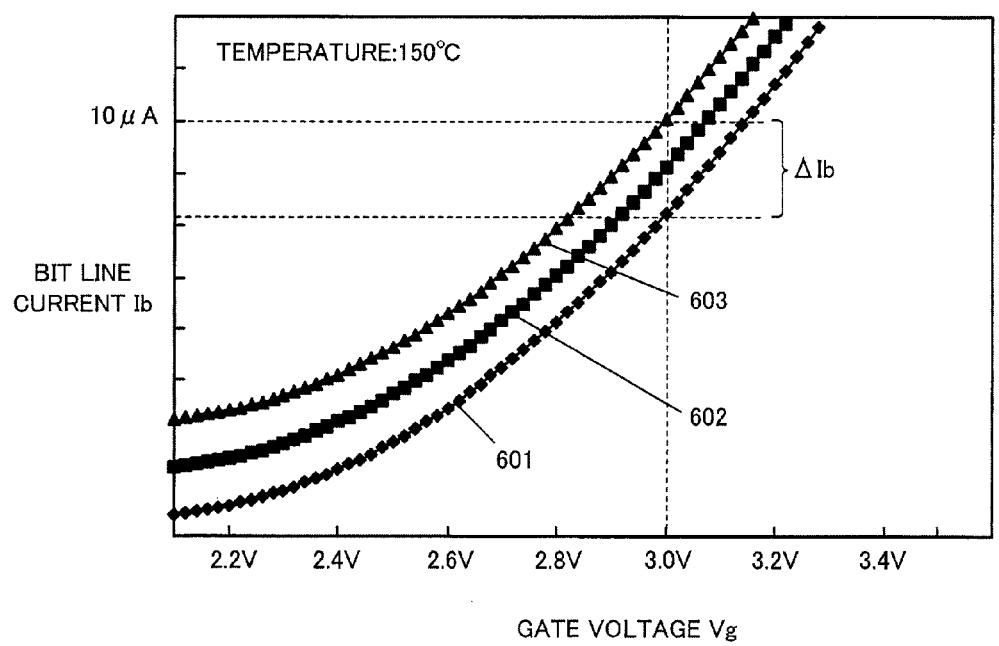
FIG. 6 is an example of the Ib (bit line current)-Vg (gate voltage) characteristic at a high temperature (150° C.) in three cases where memory cells are connected to a bit line.

FIG. 6 is an example of the Ib (bit line current)-Vg (gate voltage) characteristic at a high temperature (150° C.) in three cases where memory cells are connected to a bit line. In FIG. 6, a vertical axis indicates bit line current Ib and a horizontal axis indicates gate voltage Vg.

A curve 601 indicates the Ib-Vg characteristic obtained in the case of only a selected memory cell (above memory cell which is an object of verification) being connected to a bit line. A curve 602 indicates the Ib-Vg characteristic obtained in the case of not only the selected memory cell but also five non-selected memory cells (five bits) for which threshold voltage Vt is the above threshold voltage Vtsp for soft program verify being connected to the same bit line. A curve 603 indicates the Ib-Vg characteristic obtained in the case of not only the selected memory cell but also ten non-selected memory cells (ten bits) for which threshold voltage Vt=Vtsp being connected to the same bit line.

For example, it is assumed that when Ib is greater than or equal to 10 µA at Vg=3.0 V at erase verify time, the verification result "Pass" is obtained.

Bit line current Ib which flows in the case of many non-selected memory cells for which threshold voltage Vt=Vtsp being connected to the bit line is strong by the influence of a leakage current, compared with the case where only the selected memory cell is connected to the bit line. For example, if the ten non-selected memory cells are connected to the same bit line, a leakage current corresponding to ΔIb flows into the bit line, compared with the case where only the selected memory cell is connected to the bit line.

In the case of FIG. 6, when Vg=3.0, Ib which flows through the selected memory cell is weaker than 10 µA, and thus the verification result "Fail" is obtained (curve 601). However, if the ten non-selected memory cells are connected to the same bit line, Ib reaches a level at which the verification result "Pass" is obtained (curve 603). That is to say, the possibility that the erased state of a selected memory cell is not determined arises by the influence of a leakage current which flows through a non-selected memory cell.

In order to eliminate such possibility, with the nonvolatile memory 50 according to the second embodiment gate voltage is also supplied to a non-selected reference cell in the reference cell array 52 in the step of supplying gate voltage at erase verify time (step S11a indicated in FIG. 3) to increase an electric current which flows along a selected bit line. That is to say, with the nonvolatile memory 50 an electric current corresponding to a leakage current which flows in the memory cell array 51 is made to flow along a bit line in the reference cell array 52. This lessens the influence of a leakage current which flows in the memory cell array 51 on the result of a comparison made by the sense amplifier 60.

Figure 7:
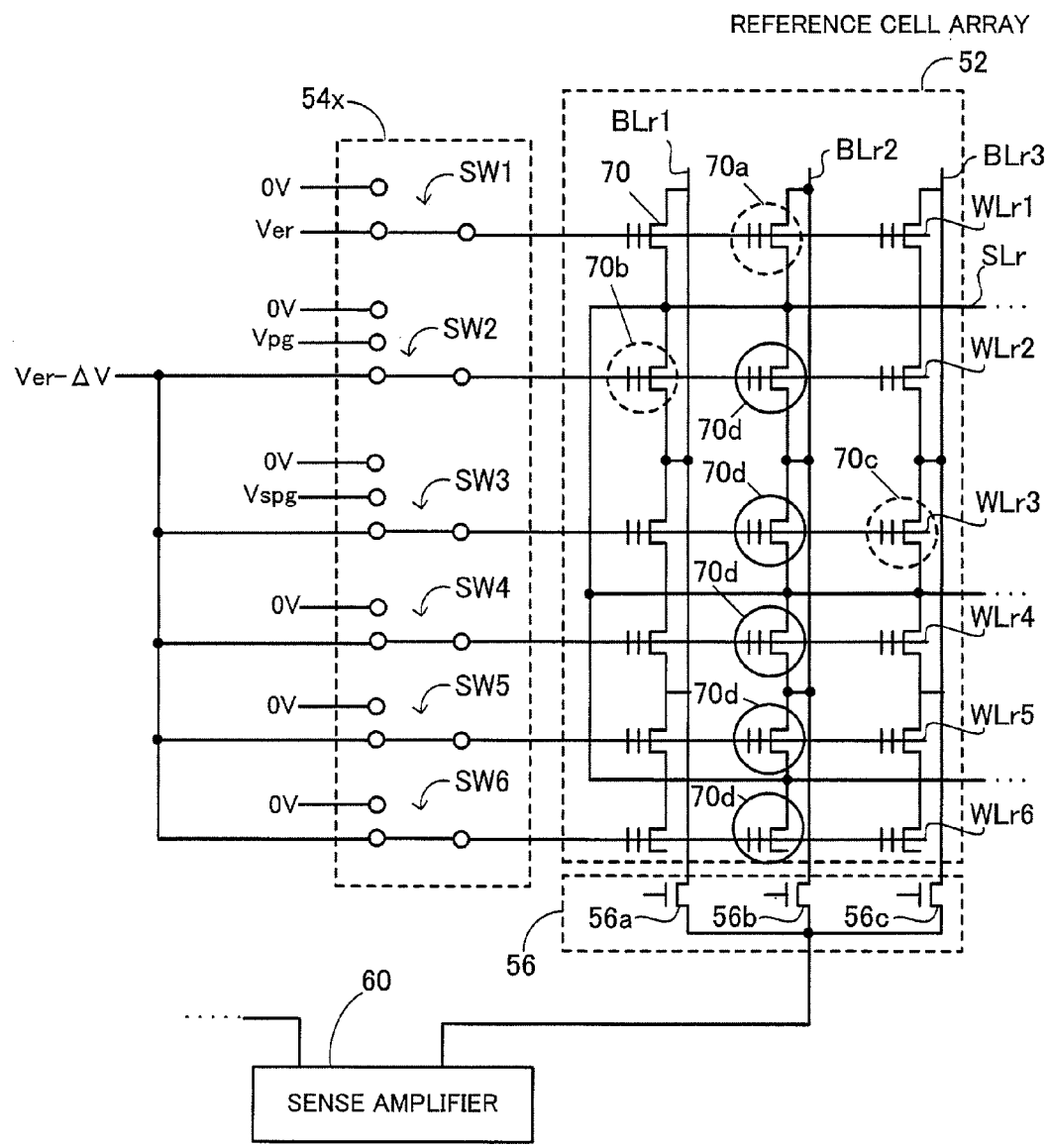
FIG. 7 is an example of a reference cell array included in the nonvolatile memory according to the second embodiment and an example of voltage applied to a word line.

FIG. 7 is an example of the reference cell array included in the nonvolatile memory according to the second embodiment and an example of voltage applied to a word line.

A reference cell array 52 includes a plurality of reference cells 70, three bit lines BLr1, BLr2, and BLr3, a source line SLr, and word lines WLr1, WLr2, WLr3, WLr4, WLr5, and WLr6. In addition, a black dot in FIG. 7 indicates a connection.

In the example of FIG. 7, of reference cells 70 connected to the bit line BLr2, the one whose gate is connected to the word line WLr1 is a reference cell 70a for erase verify. Of the reference cells 70 connected to the bit line BLr2, the ones whose gates are connected to the word lines WLr2 through WLr6 will be referred to as dummy cells 70d. The reference cell 70a for erase verify and the dummy cells 70d are also connected to the source line SLr.

Furthermore, in the example of FIG. 7, a reference cell 70 connected to the bit line BLr1, the word line WLr2, and the source line SLr is a reference cell 70b for program verify. In addition, a reference cell 70 connected to the bit line BLr3, the word line WLr3, and the source line SLr is a reference cell 70c for soft program verify. No reference cells 70 other than the one adjacent to the reference cell 70b for program verify are connected to the bit line BLr1. No reference cells 70 other than the one adjacent to the reference cell 70c for soft program verify are connected to the bit line BLr3.

A part of the X decoder 54 illustrated in FIG. 2 is schematically illustrated as a switch section 54x. The switch section 54x includes switches SW1, SW2, SW3, SW4, SW5, and SW6. The switch SW1 is used for performing switching between applying voltage Ver to the word line WLr1 and making the potential of the word line WLr1 0 V. The switch SW2 is used for performing switching between applying voltage Vpg or voltage (Ver-ΔV) to the word line WLr2 and making the potential of the word line WLr2 0 V. The switch SW3 is used for performing switching between applying voltage Vspg or voltage (Ver-ΔV) to the word line WLr3 and making the potential of the word line WLr3 0 V. The switch SW4 is used for performing switching between applying voltage (Ver-ΔV) to the word line WLr4 and making the potential of the word line WLr4 0 V. The switch SW5 is used for performing switching between applying voltage (Ver-ΔV) to the word line WLr5 and making the potential of the word line WLr5 0 V. The switch SW6 is used for performing switching between applying voltage (Ver-ΔV) to the word line WLr6 and making the potential of the word line WLr6 0 V.

The Y decoder 56 includes transistors 56a, 56b, and 56c each of which is an n-channel MOSFET (Metal-Oxide Semiconductor Field Effect Transistor).

A drain of the transistor 56a is connected to the bit line BLr1. A drain of the transistor 56b is connected to the bit line BLr2. A drain of the transistor 56c is connected to the bit line BLr3. The sense amplifier 60 is connected to sources of the transistors 56a, 56b, and 56c. Selection signals from the state machine 62 illustrated in FIG. 2 are inputted to gates of the transistors 56a, 56b, and 56c.

At erase verify time the transistors 56a and 56c are turned off by selection signals, the transistor 56b is turned on by a selection signal, and the bit line BLr2 is connected to the sense amplifier 60. At program verify time the transistor 56a is turned on by a selection signal, the transistors 56b and 56c are turned off by selection signals, and the bit line BLr1 is connected to the sense amplifier 60. At soft program verify time the transistors 56a and 56b are turned off by selection signals, the transistor 56c is turned on by a selection signal, and the bit line BLr3 is connected to the sense amplifier 60.

Threshold voltage Vt is set for each reference cell 70 at a test stage. For example, threshold voltage Vt is set for the reference cell 70a for erase verify so that an electric current of 10 µA will flow at a gate voltage of Ver (3 V, for example) and a drain voltage of 1 V. Threshold voltage Vt is set for the reference cell 70b for program verify so that an electric current of 10 µA will flow at a gate voltage of Vpg (6 V, for example) and a drain voltage of 1 V. Threshold voltage Vt is set for the reference cell 70c for soft program verify so that an electric current of 10 µA will flow at a gate voltage of Vspg (1 V, for example) and a drain voltage of 1 V. 10 µA is an example of a target electric current.

First the same threshold voltage Vt that is set for the reference cell 70a for erase verify is set for the dummy cells 70d at erase verify time. This makes it possible to set threshold voltage at the same gate voltage and prevent test time from becoming longer.

After that, the gate voltage generator 59 applies the above voltage Ver to a gate of the reference cell 70a for erase verify and applies voltage (Ver-ΔV) to gates of the dummy cells 70d via the switches SW2 through SW6.

Voltage (Ver-ΔV) is set according to the magnitude of a leakage current that flows through a non-selected memory cell and that is included in an electric current which flows along a bit line to which a selected memory cell is connected. For example, voltage (Ver-ΔV) is set according to the number of non-selected memory cells so that an increase (ΔIb indicated in FIG. 6) which is included in bit line current Ib indicated in FIG. 6 and which is caused by a leakage current will flow through the dummy cells 70d.

In addition, as indicated in FIG. 5, a leakage current changes according to temperature, so voltage (Ver-ΔV) is set on the basis of a change in leakage current according to temperature.

Figure 8:
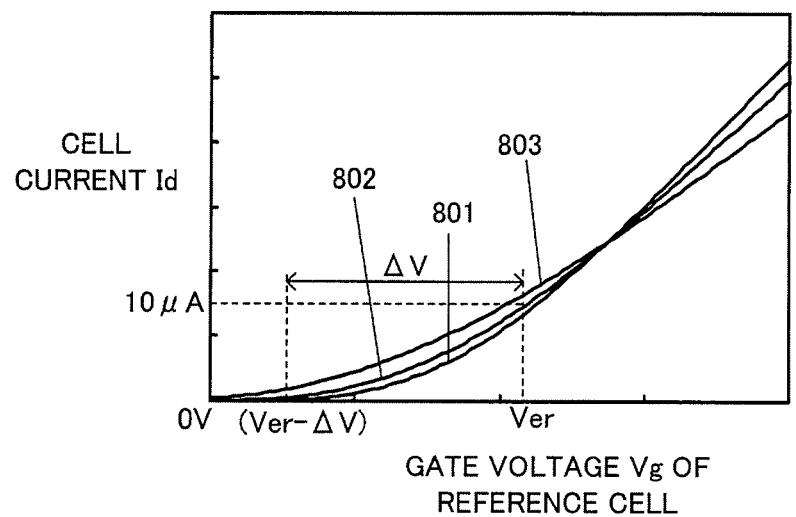
FIG. 8 is an example of setting voltage (Ver-ΔV)

FIG. 8 is an example of setting voltage (Ver-ΔV). In FIG. 8, a vertical axis indicates cell current Id which flows through a reference cell, and a horizontal axis indicates gate voltage Vg of the reference cell.

In the example of FIG. 8, curves 801, 802, and 803 indicate the relationship at temperatures of −40° C. (low temperature), 25° C. (room temperature), and 150° C. (high temperature), respectively, between gate voltage Vg of a reference cell and cell current Id which flows through the reference cell.

For example, voltage (Ver-ΔV) is set so that cell current Id corresponding to about several percent of 10 µA will flow at the low temperature or the room temperature. Voltage (Ver-ΔV) is set so that cell current Id corresponding to about five to ten percent of 10 µA will flow at the high temperature. In the example of FIG. 7, the number of the dummy cells 70d connected to the bit line BLr2 is five. However, the number of the dummy cells 70d connected to the bit line BLr2 is not limited to five and depends on the magnitude of a leakage current to be generated.

After gate voltage is set in the above way, the sense amplifier 60 compares an electric current which flows along a bit line selected in the memory cell array 51 with an electric current which flows along the bit line BLr2 and outputs a comparison result to the state machine 62.

At program verify time, voltage Vpg is applied to the word line WLr2 by the switch SW2 and the potential of the other word lines WLr1 and WLr3 through WLr6 is made 0 V by the switches SW1 and SW3 through SW6 respectively.

Furthermore, at soft program verify time, voltage Vspg is applied to the word line WLr3 by the switch SW3 and the potential of the other word lines WLr1, WLr2, and WLr4 through WLr6 is made 0 V by the switches SW1, SW2, and SW4 through SW6 respectively.

At program verify time or soft program verify time there is no need to pass a leakage current through a non-selected reference cell, so the potential of a non-selected word line is made 0 V in the above way.

By adopting the above method, an electric current corresponding to a leakage current which flows through a non-selected memory cell in the memory cell array 51 can be passed in the reference cell array 52 at erase verify time. As a result, the influence of a leakage current which flows into a bit line in the memory cell array 51 connected to the sense amplifier 60 on the result of a comparison made by the sense amplifier 60 can be reduced.

This makes it possible to prevent the sense amplifier 60 from outputting an erroneous comparison result and to perform erase verify with accuracy.

In addition, by controlling the number of the dummy cells 70d connected to the same bit line BLr2 where the reference cell 70a for erase verify is connected, the magnitude of an electric current which flows along the bit line BLr2 can easily be controlled.

Examples of the gate voltage generator 59 which supplies the above gate voltage to the reference cell array 52 and the X decoder 54 will now be described.

(Examples of the Gate Voltage Generator 59 and the X Decoder 54)

Figure 9:
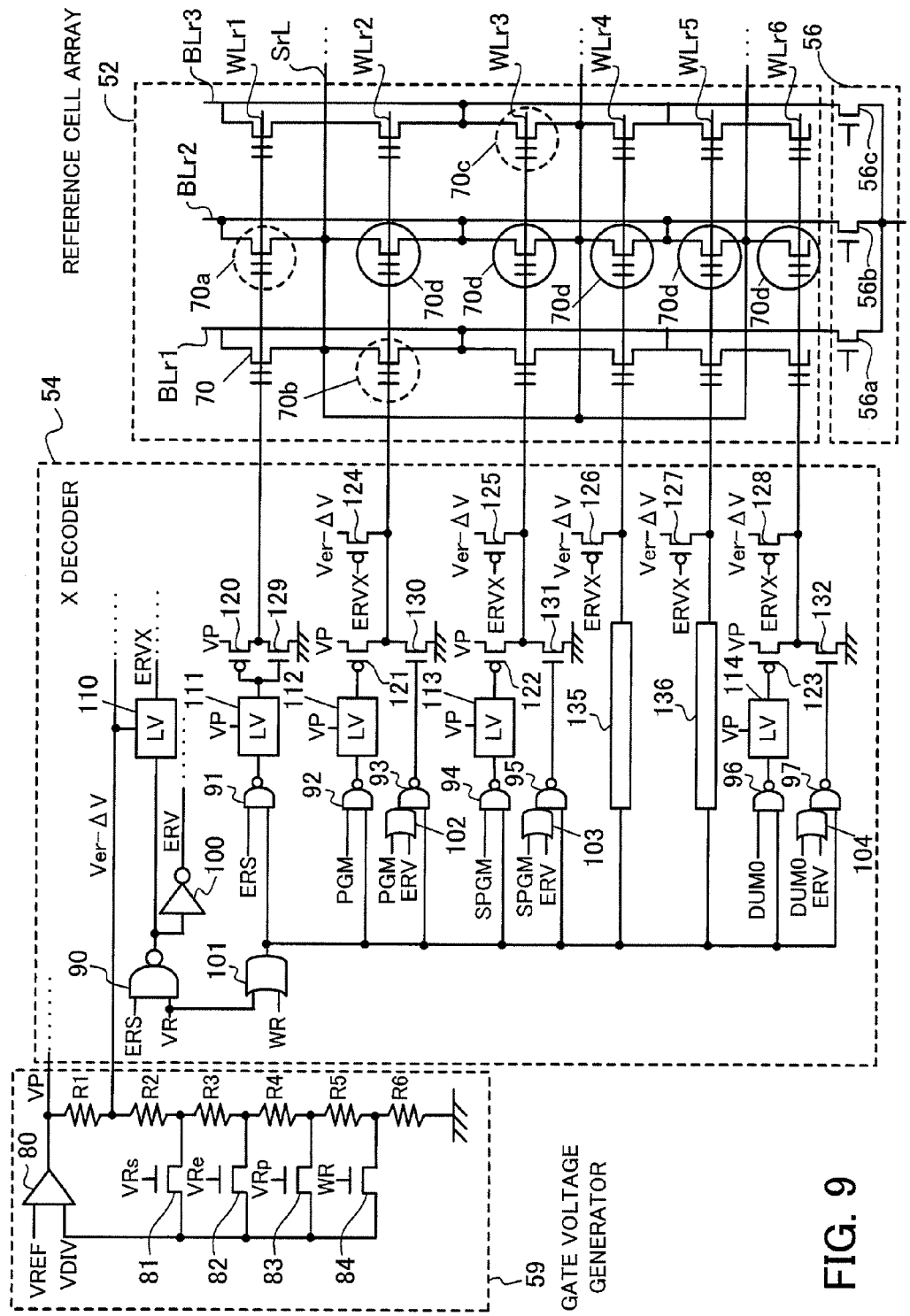
FIG. 9 is examples of circuits of a gate voltage generator and an X decoder.

FIG. 9 is examples of circuits of the gate voltage generator and the X decoder. FIG. 9 also illustrates the reference cell array 52 and the Y decoder 56 illustrated in FIG. 7.

The gate voltage generator 59 includes a comparator 80, transistors 81, 82, 83, and 84, each of which is an n-channel MOSFET, and resistors R1, R2, R3, R4, R5, and R6.

Reference voltage VREF is inputted from a reference voltage generation circuit (not illustrated) to one input terminal of the comparator 80. The other input terminal of the comparator 80 is connected to drains of the transistors 81 through 84. A signal VP is outputted from an output terminal of the comparator 80 and is supplied to the X decoder 54.

The resistors R1 through R6 are connected in series between the output terminal of the comparator 80 and a ground terminal. A source of the transistor 81 is connected to a node between the resistors R2 and R3. A source of the transistor 82 is connected to a node between the resistors R3 and R4. Furthermore, a source of the transistor 83 is connected to a node between the resistors R4 and R5. A source of the transistor 84 is connected to a node between the resistors R5 and R6. Mode signals VRs, VRe, VRp, and WR are inputted from the above state machine 62 to gates of the transistors 81 through 84 respectively.

In the gate voltage generator 59 illustrated in FIG. 9, the comparator 80 compares voltage VDIV obtained by dividing the signal VP by the resistors with the reference voltage VREF, and controls the potential level of the signal VP.

When a reference cell 70 is programmed (written), the mode signal WR becomes "1" and the mode signals VRs, VRe, and VRp become "0". The transistor 84 goes into an ON state and the transistors 81 through 83 go into an OFF state. At this time the potential level of the signal VP is maximized. At soft program verify time, the mode signal VRs becomes "1" and the other mode signals VRe, VRp, and WR become "0". The transistor 81 goes into an ON state and the transistors 82 through 84 go into an OFF state. At erase verify time, the mode signal VRe becomes "1" and the other mode signals VRs, VRp, and WR become "0". The transistor 82 goes into an ON state and the transistors 81, 83, and 84 go into an OFF state. At program verify time, the mode signal VRp becomes "1" and the other mode signals VRs, VRe, and WR become "0". The transistor 83 goes into an ON state and the transistors 81, 82, and 84 go into an OFF state.

The potential level of the signal VP at erase verify time is the above gate voltage (voltage Ver) for the reference cell 70a for erase verify. In addition, at erase verify time voltage (generated by dividing the voltage of the signal VP by the resistors) gotten from the node between the resistors R1 and R2 is gate voltage (voltage (Ver-ΔV)) for the dummy cells 70d.

The values of the resistors R1 through R6 are controlled so that the potential level of the signal VP will be, for example, 6 V, 3 V, and 1 V at program verify time, erase verify time, and soft program verify time respectively.

The X decoder 54 includes NAND circuits 90, 91, 92, 93, 94, 95, 96, and 97, an inverter 100, OR circuits 101, 102, 103, and 104, and level shifters (indicated by LVs) 110, 111, 112, 113, and 114. In addition, the X decoder 54 includes transistors 120, 121, 122, 123, 124, 125, 126, 127, and 128, each of which is a p-channel MOSFET, and transistors 129, 130, 131, and 132, each of which is an n-channel MOSFET. The structure of circuit sections 135 and 136 (not illustrated) is the same as that of a circuit section including the NAND circuits 96 and 97, the OR circuit 104, the level shifter 114, and the transistors 123 and 132.

Mode signals ERS and VR are inputted from the state machine 62 to the NAND circuit 90 and the NAND circuit 90 outputs the result of a NAND logical operation of them. The mode signal ERS becomes "1" at erase operation time or erase verify time. The mode signal VR becomes "1" at verify time. The inverter 100 outputs a signal ERV obtained by inverting the level of the signal outputted from the NAND circuit 90. The level shifter 110 raises the voltage of the signal outputted from the NAND circuit 90 by the use of voltage (Ver-ΔV), and outputs a generated signal ERVX.

The mode signal VR and a mode signal WR are inputted to the OR circuit 101 and the OR circuit 101 outputs the result of an OR logical operation of them. An output from the OR circuit 101 becomes "1" at verify time or program time. The signal outputted from the OR circuit 101 is inputted to one input terminal of each of the NAND circuits 91 through 97.

Furthermore, the mode signal ERS is inputted to the other input terminal of the NAND circuit 91. A mode signal PGM is inputted to the other input terminal of the NAND circuit 92. A mode signal SPGM is inputted to the other input terminal of the NAND circuit 94. A signal outputted from the OR circuit 102 is inputted to the other input terminal of the NAND circuit 93. A signal outputted from the OR circuit 103 is inputted to the other input terminal of the NAND circuit 95. Furthermore, a mode signal DUM0 is inputted to the other input terminal of the NAND circuit 96. A signal outputted from the OR circuit 104 is inputted to the other input terminal of the NAND circuit 97.

The mode signal PGM and the signal ERV are inputted to the OR circuit 102. The mode signal SPGM and the signal ERV are inputted to the OR circuit 103. The mode signal DUM0 and the signal ERV are inputted to the OR circuit 104.

The mode signals PGM, SPGM, and DUM0 are supplied from the state machine 62. The signal ERV is a signal outputted from the above inverter 100. The mode signal PGM becomes "1" at programming time or program verify time. The mode signal SPGM becomes "1" at soft programming time or soft program verify time. The mode signal DUM0 becomes "1" when the dummy cell 70d connected to the word line WLr6 is driven.

The level shifters 111 through 114 raise the voltage of signals outputted from the NAND circuits 91, 92, 94, and 96, respectively, by the use of the signal VP outputted from the gate voltage generator 59.

The transistors 120 and 129 form an inverter. A signal outputted from the level shifter 111 is inputted to gates of the transistors 120 and 129. The signal VP is supplied to a source of the transistor 120. A source of the transistor 129 is grounded. In addition, drains of the transistors 120 and 129 are connected to the word line WLr1.

Furthermore, signals outputted from the level shifters 112 through 114 are inputted to gates of the transistors 121 through 123 respectively. The signal VP is supplied to sources of the transistors 121 through 123. Drains of the transistors 121 through 123 are connected to the word lines WLr2, WLr3, and WLr6 respectively.

Furthermore, sources of the transistors 130 through 132 are grounded. Drains of the transistors 130 through 132 are connected to the drains of the transistors 121 through 123 and the word lines WLr2, WLr3, and WLr6, respectively. In addition, signals outputted from the NAND circuits 93, 95, and 97 are inputted to gates of the transistors 130 through 132 respectively.

Sources of the transistors 124 through 128 are connected to the node between the resistors R1 and R2 included in the gate voltage generator 59. At erase verify time voltage (Ver-ΔV) is inputted to the sources of the transistors 124 through 128. Furthermore, the signal ERVX outputted from the level shifter 110 is inputted to gates of the transistors 124 through 128. Drains of the transistors 124 through 128 are connected to the word lines WLr2 through WLr6 respectively.

The operation of the X decoder 54 controlled by the mode signals from the state machine 62 will now be described.

As indicated in FIG. 3, if erase verify is performed, pre-programming is performed and threshold voltage is set for reference cells 70. At this time the state machine 62 sets the mode signals WR, ERS, PGM, SPGM, DUM0 (and a signal corresponding to the mode signal DUM0 supplied to the circuit sections 135 and 136) to "1" and sets the other mode signals indicated in FIG. 9 to "0".

As a result, the transistors 120 through 123 go into an ON state. The transistors 124 through 128 go into an OFF state because the potential of their gates is equal to that of their sources and back bias. In addition, the transistors 129 through 132 also go into an OFF state. Accordingly, the signal VP whose voltage level is for programming is supplied to the word lines WLr1 through WLr6 and threshold voltage is set for the reference cell 70a for erase verify and the dummy cells 70d connected to the bit line BLr2.

At erase verify time the state machine 62 sets the mode signals VRe, ERS, VR, DUM0 (and a signal corresponding to the mode signal DUM0 supplied to the circuit sections 135 and 136) to "1" and sets the other mode signals indicated in FIG. 9 to "0".

As a result, the transistor 120 remains an ON state and the transistors 129 through 132 remain an OFF state. However, the transistors 121 through 123 go into an OFF state and the transistors 124 through 128 go into an ON state. At erase verify time the voltage level of the signal VP is voltage Ver.

Accordingly, voltage Ver is applied to the word line WLr1 and voltage (Ver-ΔV) is applied to the other word lines WLr2 through WLr6. Voltage (Ver-ΔV) is applied to the gates of the dummy cells 70d, so at erase verify time it is possible to generate a leakage current which flows from the dummy cells 70d into the bit line BLr2.

If the reference cell 70b for program verify is programmed, the state machine 62 sets the mode signals WR and PGM to "1" and sets the other mode signals indicated in FIG. 9 to "0".

As a result, the transistors 121, 129, 131, and 132 go into an ON state. The transistors 120 and 122 through 128 go into an OFF state. Accordingly, the signal VP whose voltage level is for programming is supplied to the word line WLr2 and the potential of the other word lines WLr1 and WLr3 through WLr6 becomes 0 V. As a result, the reference cell 70b for program verify connected to the bit line BLr1 is programmed.

At program verify time the state machine 62 sets the mode signals VRp, PGM, and VR to "1" and sets the other mode signals indicated in FIG. 9 to "0". As a result, the signal VP whose voltage level is for program verify is supplied to the word line WLr2 and the potential of the other word lines WLr1 and WLr3 through WLr6 remains at 0 V.

The use of the above gate voltage generator 59 and X decoder 54 makes it possible to apply voltage Ver at erase verify time to the gate of the reference cell 70a for erase verify and to apply voltage (Ver-ΔV) at erase verify time to the gates of the dummy cells 70d.

Third Embodiment

A nonvolatile memory according to a third embodiment includes each section illustrated in FIG. 2. This is the same with the nonvolatile memory 50 according to the second embodiment. However, the circuit structure of a reference cell array, an X decoder, and a gate voltage generator included in a nonvolatile memory according to a third embodiment differs in the following respects from that of the reference cell array 52, the X decoder 54, and the gate voltage generator 59, respectively, which are included in the nonvolatile memory 50 according to the second embodiment and which are illustrated in FIG. 9.

Figure 10:
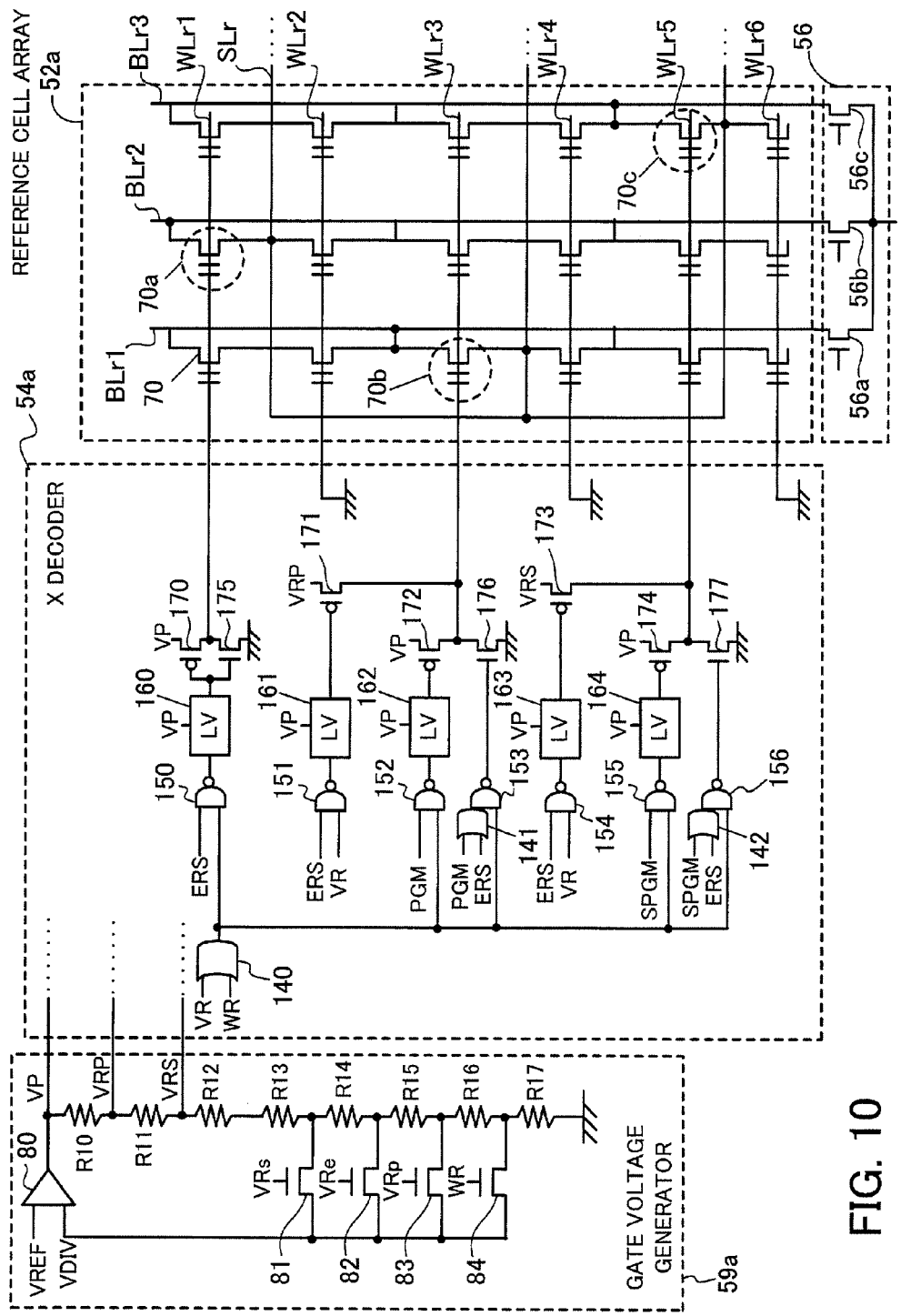
FIG. 10 is examples of a reference cell array, an X decoder, and a gate voltage generator included in a nonvolatile memory according to a third embodiment.

FIG. 10 is examples of a reference cell array, an X decoder, and a gate voltage generator included in a nonvolatile memory according to a third embodiment.

Components in a reference cell array and a gate voltage generator of a nonvolatile memory according to a third embodiment which are the same as those included in the reference cell array 52 and the gate voltage generator 59 of the nonvolatile memory 50 according to the second embodiment illustrated in FIG. 9 are marked with the same numerals. FIG. 10 also illustrates a Y decoder 56.

In the example of FIG. 10, the one of a plurality of reference cells 70 in a reference cell array 52a which is connected to a bit line BLr1, a word line WLr3, and a source line SLr is a reference cell 70b for program verify. In addition, the one of the plurality of reference cells 70 which is connected to a bit line BLr3, a word line WLr5, and the source line SLr is a reference cell 70c for soft program verify.

No reference cells 70 other than the reference cell 70b for program verify and the one adjacent thereto are connected to the bit line BLr1. No reference cells 70 other than a reference cell 70a for erase verify are connected to a bit line BLr2. No reference cells 70 other than the reference cell 70c for soft program verify and the one adjacent thereto are connected to the bit line BLr3.

Word lines WLr2, WLr4, and WLr6 to which the reference cell 70a for erase verify, the reference cell 70b for program verify, or the reference cell 70c for soft program verify is not connected are grounded and their potential is 0 V.

A gate voltage generator 59a includes a comparator 80 and transistors 81 through 84. This is the same with the gate voltage generator 59 illustrated in FIG. 9. In addition, the gate voltage generator 59a includes resistors R10, R11, R12, R13, R14, R15, R16, and R17. The number of the resistors included in the gate voltage generator 59a is larger than that of the resistors included in the gate voltage generator 59 illustrated in FIG. 9. The reason for this is that the number of voltage values to be gotten by dividing voltage by resistors is larger.

Voltage VRP is gotten from a node between the resistors R10 and R11 as gate voltage to be supplied to the reference cell 70b for program verify at the time of erase verify. In addition, voltage VRS is gotten from a node between the resistors R11 and R12 as gate voltage to be supplied to the reference cell 70c for soft program verify at the time of erase verify. Voltage VRP is lower than gate voltage supplied to the reference cell 70b at the time of program verify. Voltage VRS is lower than gate voltage supplied to the reference cell 70c at the time of soft program verify.

An X decoder 54a includes OR circuits 140, 141, and 142, NAND circuits 150, 151, 152, 153, 154, 155, and 156, and level shifters 160, 161, 162, 163, and 164. In addition, the X decoder 54a includes transistors 170, 171, 172, 173, and 174, each of which is a p-channel MOSFET, and transistors 175, 176, and 177, each of which is an n-channel MOSFET.

Mode signals VR and WR are inputted from a state machine 62 to the OR circuit 140 and the OR circuit 140 outputs the result of an OR logical operation of them. An output from the OR circuit 140 is "1" at verify time or program time. The signal outputted from the OR circuit 140 is inputted to one input terminal of each of the NAND circuits 150, 152, 153, 155, and 156.

Furthermore, a mode signal ERS is inputted to the other input terminal of the NAND circuit 150. A mode signal PGM is inputted to the other input terminal of the NAND circuit 152. A mode signal SPGM is inputted to the other input terminal of the NAND circuit 155. A signal outputted from the OR circuit 141 is inputted to the other input terminal of the NAND circuit 153. A signal outputted from the OR circuit 142 is inputted to the other input terminal of the NAND circuit 156.

The mode signals PGM and ERS are inputted to the OR circuit 141. The mode signals SPGM and ERS are inputted to the OR circuit 142.

The mode signals ERS and VR are inputted to the NAND circuits 151 and 154. Signals outputted from the NAND circuits 151 and 154 are usually "1" and are "0" only at the time of performing erase verify.

The level shifters 160 through 164 raise the voltage of signals outputted from the NAND circuits 150, 151, 152, 154, and 155, respectively, by the use of a signal VP outputted from the gate voltage generator 59a.

The transistors 170 and 175 form an inverter. A signal outputted from the level shifter 160 is inputted to gates of the transistors 170 and 175. The signal VP is supplied to a source of the transistor 170. A source of the transistor 175 is grounded. In addition, drains of the transistors 170 and 175 are connected to a word line WLr1.

Furthermore, a signal outputted from the level shifter 161 is inputted to a gate of the transistor 171. Voltage VRP generated by the gate voltage generator 59a is supplied to a source of the transistor 171. A drain of the transistor 171 is connected to the word line WLr3. A signal outputted from the level shifter 162 is inputted to a gate of the transistor 172. The signal VP is supplied to a source of the transistor 172. A drain of the transistor 172 is connected to the word line WLr3. In addition, a signal outputted from the level shifter 163 is inputted to a gate of the transistor 173. Voltage VRS generated by the gate voltage generator 59a is supplied to a source of the transistor 173. A drain of the transistor 173 is connected to the word line WLr5. A signal outputted from the level shifter 164 is inputted to a gate of the transistor 174. The signal VP is supplied to a source of the transistor 174. A drain of the transistor 174 is connected to the word line WLr5.

Furthermore, sources of the transistors 175 through 177 are grounded. Drains of the transistors 175 through 177 are connected to the drains of the transistors 170, 172, and 174 and the word lines WLr1, WLr3, and WLr5, respectively. In addition, signals outputted from the NAND circuits 153 and 156 are inputted to gates of the transistors 176 and 177 respectively.

The operation of the X decoder 54a controlled by the mode signals from the state machine 62 will now be described.

If the reference cell 70b for program verify is programmed, the state machine 62 sets the mode signals WR and PGM to "1" and sets the other mode signals indicated in FIG. 10 to "0".

As a result, the transistors 172, 175, and 177 go into an ON state and the transistors 170, 171, 173, 174, and 176 go into an OFF state. Accordingly, the signal VP whose voltage level is for programming is supplied to the word line WLr3 and the other word lines WLr1, WLr2, and WLr4 through WLr6 become 0 V. As a result, the reference cell 70b for program verify connected to the bit line BLr1 is programmed.

At program verify time the state machine 62 sets the mode signals VRp, PGM, and VR to "1" and sets the other mode signals indicated in FIG. 10 to "0". As a result, the signal VP whose voltage level is for program verify is supplied to the word line WLr3 and the other word lines WLr1, WLr2, and WLr4 through WLr6 remain at 0 V.

As indicated in FIG. 3, if erase verify is performed, pre-programming is performed and threshold voltage is set for the reference cell 70a for erase verify. At this time the state machine 62 sets the mode signals WR and ERS to "1" and sets the other mode signals indicated in FIG. 10 to "0".

As a result, the transistor 170 goes into an ON state and the transistors 171 through 177 go into an OFF state. Accordingly, the signal VP whose voltage level is for programming is supplied to the word line WLr1 and threshold voltage is set for the reference cell 70a for erase verify connected to the bit line BLr2.

Unlike the second embodiment illustrated in FIG. 9, in this embodiment threshold voltage is not set for dummy cells. This makes it possible to reduce test time. The following method is used for generating an electric current by which the influence of a leakage current which flows in a memory cell array is curbed.

At erase verify time the state machine 62 sets the mode signals VRe, ERS, and VR to "1" and sets the other mode signals indicated in FIG. 10 to "0".

As a result, the transistors 170, 171, and 173 go into an ON state and the transistors 172, 174, and 175 through 177 go into an OFF state. At erase verify time the voltage level of the signal VP is voltage Ver, so voltage Ver is applied to the word line WLr1, which is a selected word line. Furthermore, each of the transistors 170 through 177 is in the above state. Accordingly, voltage VRP is applied to the word line WLr3, which is a non-selected word line, and voltage VRS is applied to the word line WLr5, which is a non-selected word line.

In addition, in the third embodiment at erase verify time the state machine 62 puts not only a transistor 56b in the Y decoder 56 but also transistors 56a and 56c in it into an ON state. As a result, the bit lines BLr1 and BLr3 to which the reference cell 70b for program verify and the reference cell 70c for soft program verify, respectively, are connected are electrically connected to the bit line BLr2 to which the reference cell 70a for erase verify is connected.

As stated above, voltage VRP is applied to the word line WLr3 and voltage VRS is applied to the word line WLr5. Therefore, voltage VRP is supplied to a gate of the reference cell 70b for program verify and voltage VRS is supplied to a gate of the reference cell 70c for soft program verify. As a result, cell current flows. This current increases an electric current which flows along the bit line BLr2 and which flows into a sense amplifier 60.

As a result, the influence of a leakage current which flows in the memory cell array on the result of a comparison made by the sense amplifier 60 can be reduced.

Voltage VRP and voltage VRS are set by the resistors R10 through R17 included in the gate voltage generator 59a according to the magnitude of a leakage current which flows in the memory cell array.

Furthermore, as indicated in FIG. 5, a leakage current changes according to temperature. Accordingly, voltage VRP and voltage VRS are set according to a change in leakage current due to a change in temperature. For example, it is assumed that an electric current of 10 μA flows through the reference cell 70a for erase verify at erase verify time. At this time voltage VRP and voltage VRS are set so that cell current corresponding to about several percent of 10 μA will flow through the reference cells 70b and 70c, for example, at the above the low temperature or room temperature and so that cell current corresponding to about five to ten percent of 10 μA will flow through the reference cells 70b and 70c, for example, at the high temperature.

As a result, the influence of a leakage current which flows in the memory cell array on the result of a comparison made by the sense amplifier 60 can be reduced and erase verify can be performed with accuracy.

In order to obtain at erase verify time an electric current corresponding to a leakage current which flows in the memory cell array, in the third embodiment it is desirable that there be many non-selected reference cells to which the above voltage VRP or VRS is applied.

In the example of FIG. 10, the number of the reference cell 70a for erase verify, the reference cell 70b for program verify, or the reference cell 70c for soft program verify is one. However, the number of them is not limited to one. The reference cell array 52a may include additional bit lines and reference cells may be connected to them.

(Electronic Apparatus)

Figure 11:
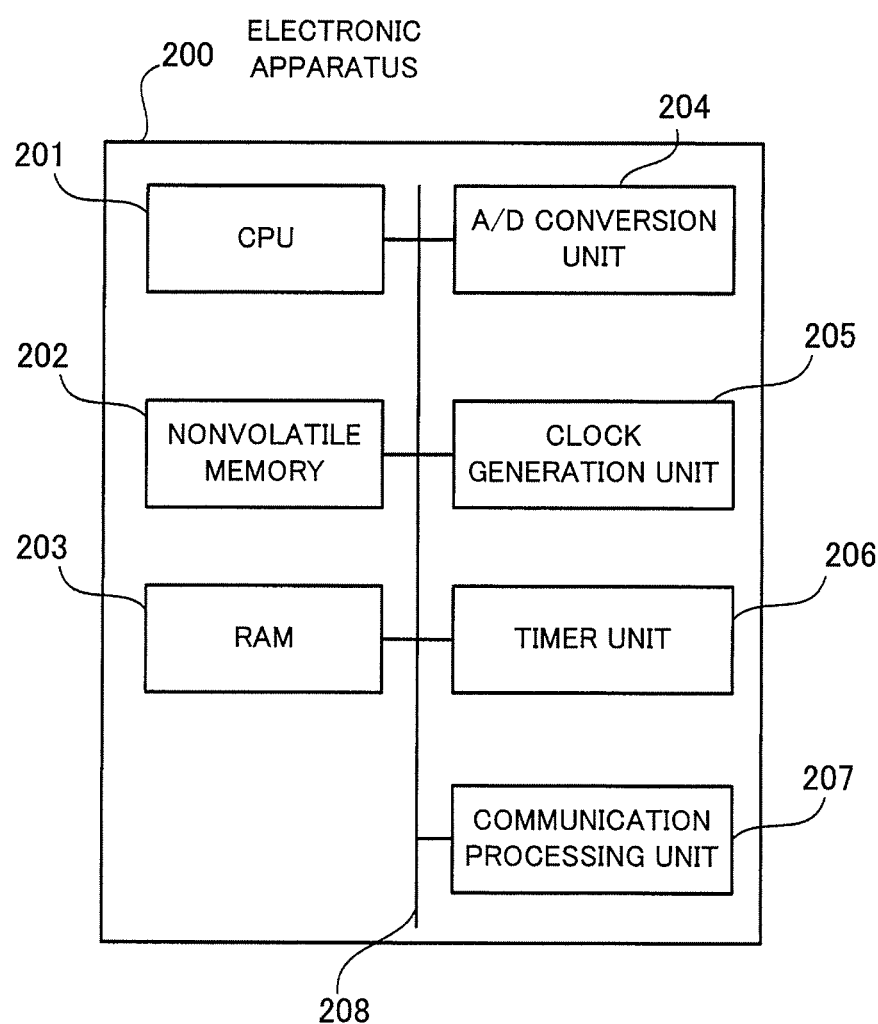
FIG. 11 is an example of an electronic apparatus including a nonvolatile memory.

FIG. 11 is an example of an electronic apparatus including a nonvolatile memory. FIG. 11 illustrates a microcontroller as an example of an electronic apparatus.

An electronic apparatus 200 includes a CPU (Central Processing Unit) 201, a nonvolatile memory 202, a RAM (Random Access Memory) 203, A/D (Analogue/Digital) conversion unit 204, a clock generation unit 205, a timer unit 206, and a communication processing unit 207. Each unit is connected to a bus 208.

The CPU 201 performs various operations and controls each unit via the bus 208.

The nonvolatile memory 202 includes each section like that illustrated in FIG. 2, and is used, like a ROM (Read Only Memory), as a memory for storing a program. On the basis of a control signal from the CPU 201, a state machine 62 generates mode signals and the above various operations are performed.

The RAM 203 temporarily stores at least a part of a program or an application program executed by the CPU 201. When the power is off, data is erased. Therefore, data stored in the RAM 203 is temporarily stored in, for example, the nonvolatile memory 202.

The A/D conversion unit 204 A/D-converts an input or output signal.

The clock generation unit 205 includes, for example, a PLL (Phase Locked Loop) circuit and generates a clock signal for operating the electronic apparatus 200.

The timer unit 206 is used for controlling timing of the electronic apparatus 200.

The communication processing unit 207 is, for example, a USB (Universal Serial Bus) interface and transmits a signal to or receives a signal from, for example, an external apparatus.

The nonvolatile memory according to the first, second, or third embodiment is used, for example, as the nonvolatile memory 202 included in the above electronic apparatus 200.

With the nonvolatile memory according to the first, second, or third embodiment erase verify can be performed with accuracy. This prevents a memory cell which is not in an erased state from being considered to be in an erased state. Accordingly, with the electronic apparatus 200 using such a nonvolatile memory, a malfunction caused by erroneously recognizing the state of a memory cell is avoided.

In the above embodiments each memory cell and each reference cell are n-channel cells. However, the present invention can be applied to a case where each memory cell and each reference cell are p-channel cells. In this case, the relationships among the magnitude of the first gate voltage, the second gate voltage, and the third gate voltage supplied to the word lines are reversed.

According to the disclosed nonvolatile memory, electronic apparatus, and verification method a deterioration in the accuracy of verification at erase verify time can be prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A nonvolatile memory comprising:
a memory cell array having a first bit line connected to N memory cells;
a reference cell array having a second bit line connected to M reference cells, the M being smaller than the N;
a comparator which compares a first electric current which flows along the first bit line with a second electric current which flows along the second bit line; and
a gate voltage generator which supplies first gate voltage at erase verify time to a first selected word line to which a first memory cell included in the N memory cells is connected, which supplies the first gate voltage at the erase verify time to a second selected word line to which a first reference cell included in the M reference cells is connected, which supplies second gate voltage at the erase verify time to a first non-selected word line connected to the memory cell array, and which supplies third gate voltage at the erase verify time to a second non-selected word line connected to the reference cell array,
wherein an electric current which flows through a reference cell connected to the second non-selected word line is stronger than an electric current which flows through a memory cell connected to the first non-selected word line.

2. The nonvolatile memory according to claim 1, wherein the third gate voltage is between the first gate voltage and the second gate voltage.

3. The nonvolatile memory according to claim 1, wherein:
the reference cells are n-channel cells; and
the third gate voltage is higher than the second gate voltage.

4. The nonvolatile memory according to claim 3, wherein:
the second non-selected word line is connected to a non-selected reference cell connected to the second bit line; and
the third gate voltage is lower than the first gate voltage.

5. The nonvolatile memory according to claim 4, wherein threshold voltage for the non-selected reference cell connected to the second bit line is equal to threshold voltage for the first reference cell.

6. The nonvolatile memory according to claim 3, wherein:
the second non-selected word line is connected to a second reference cell which is included in the M reference cells and which is connected to a third bit line;
fourth gate voltage is supplied to the second reference cell selected at verify time different from the erase verify time;
the third gate voltage is lower than the fourth gate voltage; and
the third bit line is connected to the second bit line at the erase verify time.

7. An electronic apparatus comprising:
a nonvolatile memory; and
a processor which controls the nonvolatile memory, wherein:
the nonvolatile memory includes
a memory cell array having a first bit line connected to N memory cells;
a reference cell array having a second bit line connected to M reference cells, the M being smaller than the N;
a comparator which compares a first electric current which flows along the first bit line with a second electric current which flows along the second bit line; and
a gate voltage generator which supplies first gate voltage at erase verify time to a first selected word line to which a first memory cell included in the N memory cells is connected, which supplies the first gate voltage at erase verify time to a second selected word line to which a first reference cell included in the M reference cells is connected, which supplies second gate voltage at erase verify time to a first non-selected word line connected to the memory cell array, and which supplies third gate voltage at erase verify time to a second non-selected word line connected to the reference cell array; and
an electric current which flows through a reference cell connected to the second non-selected word line is stronger than an electric current which flows through a memory cell connected to the first non-selected word line.

8. A verification method for verifying a state of a memory cell included in a nonvolatile memory including a memory cell array having a first bit line connected to N memory cells and a reference cell array having a second bit line connected to M reference cells, the M being smaller than the N, the method comprising:

comparing, by a comparator, a first electric current which flows along the first bit line with a second electric current which flows along the second bit line; and supplying, by a gate voltage generator, first gate voltage at erase verify time to a first selected word line to which a first memory cell included in the N memory cells is connected, supplying, by the gate voltage generator, the first gate voltage at the erase verify time to a second selected word line to which a first reference cell included in the M reference cells is connected, supplying, by the gate voltage generator, second gate voltage at the erase verify time to a first non-selected word line connected to the memory cell array, and supplying, by the gate voltage generator, third gate voltage at the erase verify time to a second non-selected word line connected to the reference cell array, wherein an electric current which flows through a reference cell connected to the second non-selected word line is stronger than an electric current which flows through a memory cell connected to the first non-selected word line.

* * * * *